(12) United States Patent
Quinn

(10) Patent No.: US 8,362,589 B2
(45) Date of Patent: Jan. 29, 2013

(54) INTEGRATED CAPACITOR WITH CABLED PLATES

(75) Inventor: Patrick J. Quinn, Dublin (IE)

(73) Assignee: Xilinx, Inc., San Jose, CA (US)

( * ) Notice: Subject to any disclaimer, the term of this patent is extended or adjusted under 35 U.S.C. 154(b) by 318 days.

(21) Appl. No.: 12/276,293

(22) Filed: Nov. 21, 2008

(65) Prior Publication Data

US 2010/0127348 A1 May 27, 2010

(51) Int. Cl.
*H01L 21/02* (2006.01)
(52) U.S. Cl. ............... 257/532; 361/303; 257/E29.343
(58) Field of Classification Search .......... 257/303–309, 257/532, E29.343; 361/303
See application file for complete search history.

(56) References Cited

U.S. PATENT DOCUMENTS

| | | |
|---|---|---|
| 1,899,176 A | 2/1933 | Bailey |
| 3,593,319 A | 7/1971 | Barber |
| 4,156,249 A | 5/1979 | Koo |
| 4,249,196 A | 2/1981 | Durney et al. |
| 4,409,608 A | 10/1983 | Yoder |
| 4,427,457 A | 1/1984 | Carlson et al. |
| 4,470,096 A | 9/1984 | Guertin |
| 4,470,099 A | 9/1984 | Sawairi |
| 4,571,543 A | 2/1986 | Raymond et al. |
| 4,639,686 A | 1/1987 | Beckenbach et al. |
| 4,700,457 A | 10/1987 | Matsukawa |
| 4,731,696 A | 3/1988 | Himes et al. |
| 4,827,323 A | 5/1989 | Tigelaar et al. |
| 4,831,431 A | 5/1989 | Hanlon |
| 4,878,151 A | 10/1989 | Gallichio |
| 4,914,546 A | 4/1990 | Alter |
| 4,937,649 A | 6/1990 | Shiba et al. |
| 4,994,688 A | 2/1991 | Horiguchi et al. |
| 5,005,103 A | 4/1991 | Kwon et al. |

(Continued)

FOREIGN PATENT DOCUMENTS

| | | |
|---|---|---|
| DE | 25 48 563 A1 | 5/1977 |
| DE | 100 46 910 A1 | 10/2001 |

(Continued)

OTHER PUBLICATIONS

Jacobsen, Jesper, Lykke "Tetromino tilings and the Tutte polynomial", Journal of Physics A: Mathematical and Theoretical, vol. 40, No. 7, Feb. 16, 2007. pp. 1439-1446.

(Continued)

*Primary Examiner* — Ha Tran T Nguyen
*Assistant Examiner* — Vongsavanh Sengdara
(74) *Attorney, Agent, or Firm* — Scott Hewett; John J. King

(57) ABSTRACT

A capacitor in an integrated circuit ("IC") has a distribution grid formed in a first patterned metal layer of the integrated circuit and a first vertical conductive filament connected to and extending away from the distribution grid along a first direction. A second vertical conductive filament is connected to the distribution grid and extends in the opposite direction. First and second grid plates are formed in the metal layers above and below the first patterned metal layer. The grid plates surround the first and second vertical conductive filaments. The distribution grid, first vertical conductive filament and second vertical conductive filament are connected to and form a portion of a first node of the capacitor and the first grid plate and the second grid plate are connected to and form a portion of a second node of the capacitor.

15 Claims, 6 Drawing Sheets

U.S. PATENT DOCUMENTS

| | | | |
|---|---|---|---|
| 5,021,920 A | 6/1991 | Smith | |
| 5,077,225 A | 12/1991 | Lee | |
| 5,083,184 A | 1/1992 | Eguchi | |
| 5,089,878 A | 2/1992 | Lee | |
| 5,117,114 A | 5/1992 | Street et al. | |
| 5,119,169 A | 6/1992 | Kozono et al. | |
| 5,142,639 A | 8/1992 | Kohyama et al. | |
| 5,155,658 A | 10/1992 | Inam et al. | |
| 5,166,858 A | 11/1992 | Frake et al. | |
| 5,172,299 A | 12/1992 | Yamada et al. | |
| 5,177,410 A | 1/1993 | Hashiguchi et al. | |
| 5,189,594 A | 2/1993 | Hoshiba | |
| 5,208,725 A | 5/1993 | Akcasu | |
| 5,275,974 A | 1/1994 | Ellul et al. | |
| 5,583,359 A * | 12/1996 | Ng et al. | 257/306 |
| 5,712,813 A | 1/1998 | Zhang | |
| 5,868,388 A | 2/1999 | Wood et al. | |
| 5,939,766 A | 8/1999 | Stolmeijer et al. | |
| 6,037,621 A | 3/2000 | Wilson | |
| 6,064,108 A | 5/2000 | Martinez | |
| 6,066,537 A | 5/2000 | Poh | |
| 6,297,524 B1 | 10/2001 | Vathulya et al. | |
| 6,303,456 B1 | 10/2001 | Pricer et al. | |
| 6,303,457 B1 | 10/2001 | Christensen et al. | |
| 6,383,858 B1 | 5/2002 | Gupta et al. | |
| 6,385,033 B1 | 5/2002 | Javanifard et al. | |
| 6,410,954 B1 | 6/2002 | Sowlati et al. | |
| 6,417,556 B1 | 7/2002 | Long et al. | |
| 6,437,431 B1 | 8/2002 | Mbouombouo et al. | |
| 6,542,351 B1 | 4/2003 | Kwang | |
| 6,548,400 B2 | 4/2003 | Brennan et al. | |
| 6,570,210 B1 | 5/2003 | Sowlati et al. | |
| 6,597,562 B1 | 7/2003 | Hu et al. | |
| 6,625,006 B1 | 9/2003 | Aram et al. | |
| 6,653,681 B2 * | 11/2003 | Appel | 257/307 |
| 6,661,079 B1 | 12/2003 | Bikulcius | |
| 6,690,570 B2 | 2/2004 | Hajimiri et al. | |
| 6,737,698 B1 | 5/2004 | Paul et al. | |
| 6,747,307 B1 | 6/2004 | Vathulya et al. | |
| 6,765,778 B1 | 7/2004 | Du et al. | |
| 6,819,542 B2 | 11/2004 | Tsai et al. | |
| 6,822,312 B2 | 11/2004 | Sowlati et al. | |
| 6,880,134 B2 | 4/2005 | Drennan | |
| 6,882,015 B2 | 4/2005 | Bernstein et al. | |
| 6,897,505 B2 | 5/2005 | Aton | |
| 6,903,918 B1 | 6/2005 | Brennan | |
| 6,927,125 B2 | 8/2005 | Jones et al. | |
| 6,933,551 B1 | 8/2005 | Stribley et al. | |
| 6,949,781 B2 | 9/2005 | Chang et al. | |
| 6,963,122 B1 | 11/2005 | Soenen et al. | |
| 6,974,744 B1 | 12/2005 | Aram et al. | |
| 7,009,832 B1 | 3/2006 | Chen et al. | |
| 7,013,436 B1 | 3/2006 | Morton et al. | |
| 7,027,287 B2 | 4/2006 | Georgakos | |
| 7,038,296 B2 | 5/2006 | Laws | |
| 7,050,290 B2 | 5/2006 | Tang et al. | |
| 7,116,544 B1 | 10/2006 | Sutardja | |
| 7,154,734 B2 | 12/2006 | Schultz et al. | |
| 7,161,228 B1 | 1/2007 | Pettit | |
| 7,170,178 B2 | 1/2007 | Bely et al. | |
| 7,193,263 B2 | 3/2007 | Barth | |
| 7,195,971 B2 | 3/2007 | Bernstein et al. | |
| 7,202,548 B2 | 4/2007 | Lee | |
| 7,259,945 B2 | 8/2007 | Cleveland | |
| 7,259,956 B2 | 8/2007 | Fong et al. | |
| 7,271,465 B2 | 9/2007 | Jessie et al. | |
| 7,274,085 B1 | 9/2007 | Hsu et al. | |
| 7,348,624 B2 | 3/2008 | Sakaguchi et al. | |
| 7,485,914 B2 | 2/2009 | Huang et al. | |
| 7,663,233 B2 | 2/2010 | Lim | |
| 7,768,054 B2 | 8/2010 | Benetik | |
| 2005/0077581 A1 | 4/2005 | Chang et al. | |
| 2005/0135042 A1 | 6/2005 | Chiu-Kit Fong et al. | |
| 2005/0161725 A1 | 7/2005 | Da Dalt | |
| 2006/0203424 A1 | 9/2006 | Chen et al. | |
| 2007/0181973 A1 | 8/2007 | Hung et al. | |
| 2007/0187739 A1 * | 8/2007 | Liu et al. | 257/306 |
| 2007/0190760 A1 | 8/2007 | Coolbaugh et al. | |
| 2007/0278551 A1 | 12/2007 | Anthony | |
| 2007/0296013 A1 | 12/2007 | Chang et al. | |
| 2008/0158776 A1 * | 7/2008 | Chen et al. | 361/311 |
| 2009/0057826 A1 | 3/2009 | Kim et al. | |

FOREIGN PATENT DOCUMENTS

| | | |
|---|---|---|
| GB | 1 149 569 | 4/1969 |
| GB | 1 469 944 A | 4/1977 |
| JP | 57-106804 | 7/1982 |
| JP | 58-051552 | 3/1983 |
| JP | 59-91718 | 6/1984 |
| JP | 61-259560 A | 11/1986 |
| JP | 61-263251 A | 11/1986 |
| JP | 63-070550 | 3/1988 |
| JP | 01084616 A | 3/1989 |
| JP | 01096943 A | 4/1989 |
| JP | 01-313917 | 12/1989 |
| JP | 02231755 A | 9/1990 |
| JP | 02-268439 | 11/1990 |
| JP | 02-307275 | 12/1990 |
| JP | 03-008360 | 1/1991 |
| JP | 03-071612 | 3/1991 |
| JP | 04-268756 | 9/1992 |
| JP | 07-283076 | 10/1995 |
| WO | WO 03/090280 | 10/2003 |

OTHER PUBLICATIONS

Fukuda, H. et al. "Enumeration of Polyominoes, Polyiamonds and Polyhexes for Isohedral Tilings with Rotational Symmetry", Jun. 11, 2007, Computational Geometry and Graph Theory, Springer Berlin Heidelberg, Berlin Heidelberg, pp. 68-78.

Rhoads et al., "Planar tilings by polyominoes, polyhexes and polyiamonds", Journal of Computational and Applied Mathematics, Amsterdam, NL, vol. 174, No. 2, Feb. 15, 2005, pp. 329-353.

Amintoosi et al., "Using pattern matching for tiling and packing problems" European Journal of Operational Research, Amsterdam, NL, vol. 83, No. 3, Jul. 10, 2007, pp. 950-960.

Chan et al., "Analysis of MMIC Structures Using an Efficient Iterative Approach", IEEE Transactions on Microwave Theory and Techniques, vol. 36, No. 1, Jan. 1988, pp. 96-105.

Imamura et al., "Bending-Comb capacitor with a Small Parasitic Inductance", 2002 Symposium on VLSI Circuits Digest of Technical Papers, IEEE 2002, Jun. 13-15, 2002, pp. 22-25.

Rajagopalan et al., "Optimization of Metal-Metal Comb-Capacitors for RF Applications", Wireless Design & Development, Mar. 4, 2001, pp. 1-4.

Sowlati et al., "High Density Capacitance Structures in Submicron CMOS for Low Power RF Applications", International Symposium on Low Power Electronics and Design, Aug. 6-7, 2001, pp. 243-246.

Wakayama et al., "A 30-MHz Low-Jitter High-Linearity CMOS Voltage-Controlled Oscillator", IEEE Journal of Solid-State Circuits, vol. sc-22, No. 6, Dec. 1987, pp. 1074-1081.

U.S. Appl. No. 12/276,289, filed Nov. 21, 2008, Quinn, Patrick J., Xilinx, Inc. 2100 Logic Drive, San Jose, California.

U.S. Appl. No. 12/276,291, filed Nov. 21, 2008, Quinn, Patrick J., Xilinx, Inc. 2100 Logic Drive, San Jose, California.

U.S. Appl. No. 12/276,292, filed Nov. 21, 2008, Quinn, Patrick J., Xilinx, Inc. 2100 Logic Drive, San Jose, California.

U.S. Appl. No. 12/276,296, filed Nov. 21, 2008, Quinn, Patrick J., Xilinx, Inc. 2100 Logic Drive, San Jose, California.

U.S. Appl. No. 12/276,280, filed Nov. 21, 2008, Quinn, Patrick J., Xilinx, Inc. 2100 Logic Drive, San Jose, California.

Aparicio and Hajimiri, "Capacity Limits and Matching Properties of Integrated Capacitors", IEEE J. Solid-State circuits, vol. 37, No. 3, pp. 384-393, Mar. 2002.

Samavati, H. et al., "Fractal Capacitor", IEEE Journal of Solid-State Circuit, vol. 33, No. 12 pp. 2035-2041, Dec. 1998.

* cited by examiner

INTEGRATED CAPACITOR WITH CABLED PLATES

RELATED APPLICATIONS

This patent application is being concurrently filed with commonly owned U.S. Patent Application entitled SHIELDING FOR INTEGRATED CAPACITORS by Patrick J. Quinn; and with commonly owned U.S. Patent Application entitled INTEGRATED CAPACITOR WITH TARTAN CROSS SECTION by Patrick J. Quinn; and with commonly owned U.S. Patent Application entitled INTEGRATED CAPACITOR WITH INTERLINKED LATERAL FINS by Patrick J. Quinn; and with commonly owned U.S. Patent Application entitled INTEGRATED CAPACITOR WITH ARRAY OF CROSSES by Patrick J. Quinn; and with commonly owned U.S. Patent Application entitled INTEGRATED CAPACITOR WITH ALTERNATING LAYERED SEGMENTS by Jan L. de Jong et al., the disclosures of which are each hereby incorporated by reference in their entireties for all purposes.

FIELD OF THE INVENTION

The present invention relates to capacitors formed in integrated circuits ("ICs") commonly referred to as "integrated capacitors".

BACKGROUND OF THE INVENTION

Methods of fabricating ICs typically include a front-end sequence of processing, in which various electrical devices such as transistors are formed in a semiconductor substrate, and a back-end sequence of processing, generally including forming alternating layers of dielectric material and patterned conductive material (typically metal) with conductive vias or other techniques being used to interconnect the metal layers to form a three-dimensional wiring structure that connects electrical devices to other electrical devices and to terminals of the IC.

Capacitors are used in IC systems for a variety of purposes. In many instances, it is desirable to incorporate (integrate) a capacitor in the IC chip. A simple approach is to form two conductive plates with an intervening dielectric; however, this consumes a relatively large area for the capacitance obtained. One technique for increasing the capacitance of a given area is to use multiple conductive plates, each conductive plate separated from the proximate plate(s) by dielectric. Further techniques use conducting strips, also called conductive lines, conductive fingers, or conductive traces that are alternately connected to the first and second capacitor terminals (nodes). Sidewall coupling between the conductive strips provides capacitance. Layers of conducting strips, either offset or arranged in vertical congruency, can be added to further increase the capacitance of an integrated capacitor structure.

One capacitor has a number of conductive strips in successive layers connected to the first node alternating with an equal number of conductive strips connected to the second node of the integrated capacitor. The conductive strips are offset a half cell on successive layers, so that a conductive strip connected to the first node has conductive strips connected to the second node above and on both sides of it. Providing an equal number of conductive strips in a layer for each node balances the coupling of each node to the substrate, which is desirable in some applications, but undesirable in others, such as switching applications where it is desirable to have less coupling at one node. In order to reduce coupling to the substrate, a thick layer of silicon dioxide is used between the substrate and the first layer of conductive strips. This may be difficult to integrate in a standard CMOS fabrication sequence, and might require additional steps to be added to the standard process flow. The overlapping parallel conductive strips are connected at their ends using buss strips that consume additional surface area.

Another approach to providing an integrated capacitor is to have conductive strips in a layer connected to alternate nodes of the capacitor with overlapping conductive strips connected to the same node. This forms essentially a curtain of conductive strips and interconnecting vias connected to the first node of the capacitor with adjacent curtains of conductive strips and interconnecting vias connected to the second node. Overlapping conductive strips connected to the same node avoids the lost surface area associated with buss strips; however, inter-layer capacitance is reduced because the upper strip is connected to the same node as the lower strip. This effect is somewhat obviated because, as critical dimensions shrink, inter-strip capacitance becomes more dominant than inter-layer capacitance. In other words, the dielectric layer separation between successive metal layers becomes increasingly greater than the dielectric separation between conductive strips with decreasing critical dimension.

Thus, integrated capacitors overcoming the disadvantages of prior art are desired. It is further generally desired that integrated capacitors have high capacitance per unit area, low loss (resistance), and low self-inductance, which improves high-frequency applications by increasing self-resonant frequency and the quality of capacitor circuits. In some applications, it is further desirable to shield integrated capacitors from electrical noise.

SUMMARY OF THE INVENTION

A capacitor in an integrated circuit ("IC") has a distribution grid formed in a first patterned metal layer of the integrated circuit and a first vertical conductive filament connected to and extending away from the distribution grid along a first direction. A second vertical conductive filament is connected to the distribution grid and extends in the opposite direction. A first and second grid plates are formed in the metal layers above and below the first patterned metal layer. The grid plates surround the first and second vertical conductive filaments. The distribution grid, first vertical conductive filament and second vertical conductive filament are connected to and form a portion of a first node of the capacitor and the first grid plate and the second grid plate are connected to and form a portion of a second node of the capacitor.

BRIEF DESCRIPTION OF THE DRAWINGS

Accompanying drawing(s) show exemplary embodiment (s) in accordance with one or more aspects of the invention; however, the accompanying drawing(s) should not be taken to limit the invention to the embodiment(s) shown, but are for explanation and understanding only.

DETAILED DESCRIPTION

Complex ICs, such as programmable logic devices, often have several patterned metal layers separated by layers of dielectric material formed over a semiconductor substrate that are used for wiring connections and other functions. Some embodiments of the invention are adaptable to existing CMOS process sequences by using masks that form the desired patterns in the appropriate metal layers and vias through the inter-metal dielectric ("IMD") layers or interlayer dielectric ("ILD"). The vias are formed using any of several known techniques, such as contact plug, damascene, or dual damascene techniques. Similarly, the conductive strips are formed using any of several known techniques, such as thin-film metal etch, thin-film metal lift-off, damascene, and dual damascene techniques. In some embodiments, one of the conductive layers is a polysilicon or silicide layer. In a further embodiment, a conductive well in the semiconductor substrate forms a portion of a capacitor plate or a shield.

Embodiments of the invention are referred to as "cabled" because conductors, such as horizontal filaments or vertical columns, electrically connected to one node of the capacitor are surrounded by conductors electrically connected the other node of the capacitor, similar to how a conductive sheath surrounds a center conductor of a co-axial cable to shield the inner conductor from electrical noise. Some embodiments use horizontal filaments connected to a first node, which in a particular embodiment is a top node of a switching capacitor in an IC, surrounded by filaments electrically connected to a second node (e.g., bottom node) formed in multiple layers and interconnected with conductive vias ("vias"). Other embodiments form conductive columns connected to the first node surrounded by conductive grids connected to the second node. The conductive grids are formed in successive metal layers and are interconnected with vias that provide additional lateral capacitance to corresponding vias in the conductive columns. High specific capacitance with good noise shielding is achieved.

Figure 1A:
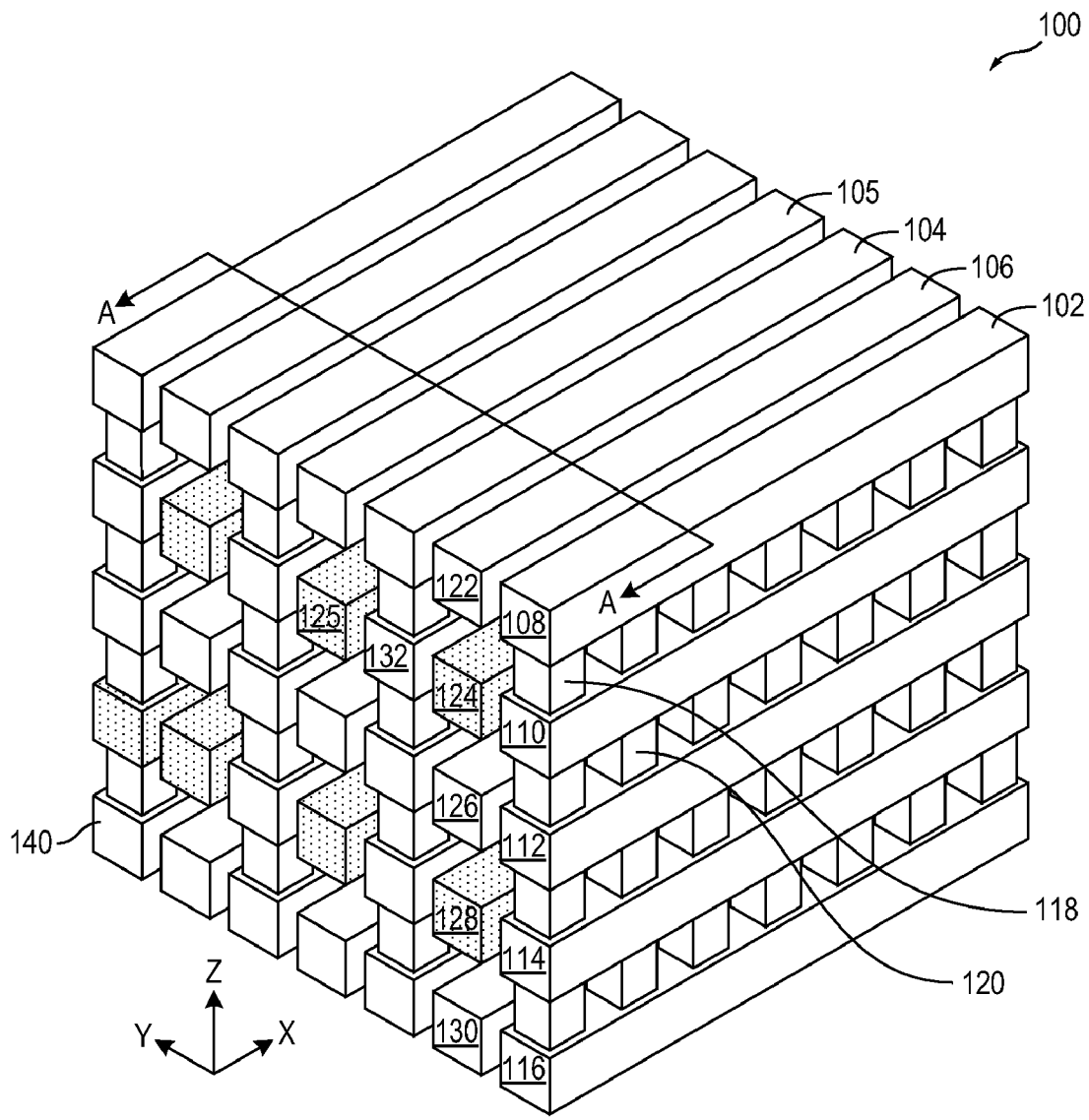
FIG. 1A is an isometric view of a portion of an integrated capacitor with horizontal cabled filaments according to an embodiment.

FIG. 1A is an isometric view of a portion 100 of an integrated capacitor according to an embodiment. The view shows the conductive portions of the integrated capacitor with dielectric material removed for purposes of illustration. Those of skill in the art of backend IC processing understand that layers of dielectric material(s), such as silicon dioxide or fluid-based dielectric materials fill the spaces between the conductive portions.

The integrated capacitor has conductive vertical panels ("conductive curtains") 102, 104 alternating with interleaved vertical planes 105, 106 in which conductive elements connected to a first node of the capacitor alternate with conductive elements connected to the second node of the capacitor in successive layers of the backend stack. The conductive curtain 102 has a number of conductive filaments 108, 11, 112, 114, 116 formed in successive patterned metal layers running horizontally (i.e., along the X direction) with conductive vias 118, 120 connecting filaments in successive patterned metal layers in the X direction to form a conductive plate in the plane defined by the X and Z directions.

The conductive curtains are connected to one of the electrical nodes of the integrated capacitor, and in a particular embodiment the conductive curtains are connected to the bottom node of a switching integrated capacitor. In a particular embodiment, the conductive filaments are metal traces, such as those formed using damascene or dual damascene techniques. In a particular embodiment, the conductive vias are also formed using a dual damascene technique.

The interleaved vertical planes 105, 106 have horizontal conductive filaments 122, 126, 130 connected to the first node of the integrated capacitor interleaved with horizontal conductive filaments 124, 128 connected to the second node of the integrated capacitor. The horizontal conductive filament 124 of the second node is surrounded by conductive filaments 122, 110, 126, 132 (and to a further extent diagonal filaments, e.g. 108, 112) of the first node. This provides high specific capacitance between the first node filaments and the second node, and also electrically shields the first node conductive filament 124, which in a specific embodiment is the top node of an integrated switching capacitor, from electronic noise and cross-coupling from other IC components and traces.

Shielding of the top node conductive elements (e.g., conductive filaments 124, 128) by bottom node conductive elements (e.g., conductive filaments and vias in conductive curtains 102, 104 and conductive filaments 122, 126, 130) is desirable for insuring low-distortion sampled data transfers in an IC, for example. In a further embodiment, an optional ground shield is used to shield the bottom node from electronic noise and cross-coupling. As used herein, the term "surround" means that each major surface (i.e., top, bottom, and both sides) of a conductor connected to one node of the capacitor (e.g., top node conductive filament 124) is adjacent to a conductor connected to the other node of the capacitor (e.g., bottom node conductive filaments 122, 108, 110, 126, 132).

The conductive filaments in the upper-most metal layer (see, e.g., FIG. 1B, M5, in which filaments 122, 108 are formed in) are all connected to one node (e.g. the bottom node) of the capacitor. Other metal layers also have conductive elements connected to a single node, such as the M3 and M1 layers shown in FIG. 1B. The conductive filaments in these single-node layers can be cross-connected by conductive cross members to form a conductive grid plate (compare, FIG. 2A, ref. num. 208). The conductive filaments electrically connected to the top node can be interconnected using buss bars and vias (not shown) at one end of the filaments, for example. In a further embodiment, a transverse conductive curtain (i.e., in the plane defined by the Y and Z directions) of the bottom node is added so that ends of the conductive filaments connected to the top node are covered. Alternatively, cross members (i.e., in the Y direction) interconnecting filaments in a layer with other filaments in that layer. A gap (not shown) would be provided to allow the cross connection. For example, a gap in filament 132 would allow a cross member to extend from filament 124 to filament 125. A conductive curtain in the plane defined by the Z and Y axes connected to the bottom node is optionally included to shield the end surfaces of the filaments 124, 125 connected to the top node.

Figure 2A:
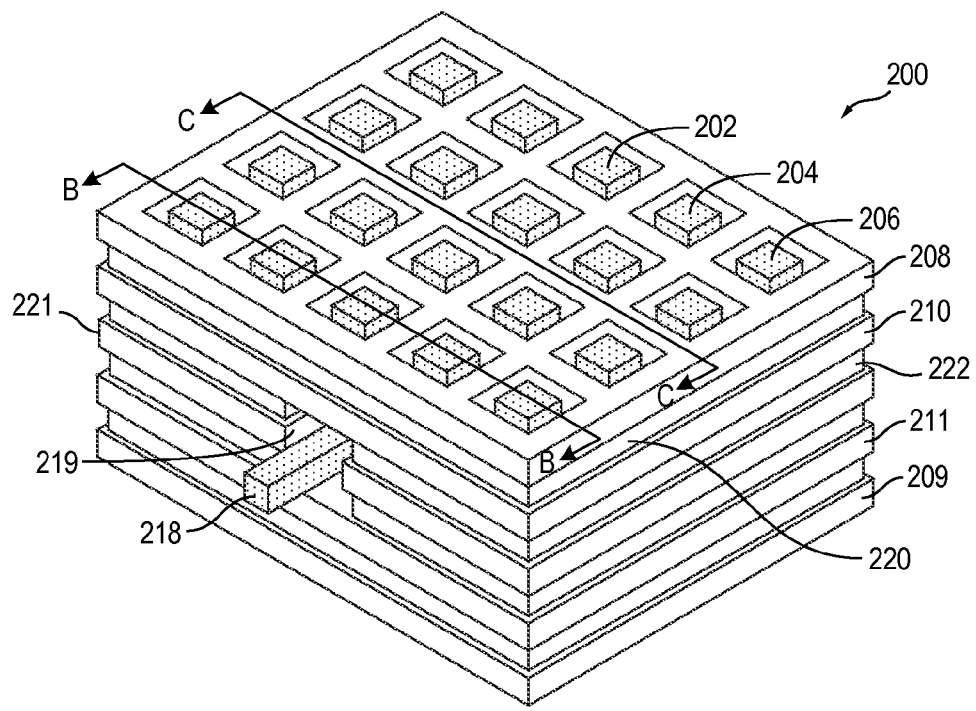
FIG. 2A is an isometric view of a portion of an integrated capacitor with vertical cabled filaments according to an embodiment of the present invention.

The connection to the top node can be lead through the top-most or bottom-most bottom node layer, or out one end or the other of the interconnected top node conductive filaments (see, e.g., FIG. 2A, ref. num. 218). In a particular embodiment, a bottom node layer shields a trace from the top node of the integrated capacitor to the connection to a switch in a switched capacitor implementation. The capacitance between the trace and the bottom node shielding adds to the capacitance of the integrated capacitor.

The terms "top" node and "bottom" node do not necessarily relate to the physical orientation of the nodes relative to the IC or other structure, but are used as terms of convenience. In some circuit applications, the top node of a capacitor indicates the node that is connected to a high-impedance or high-gain port of an amplifier or other device. In a system-on-chip ("SoC"), the accuracy on an analog-to-digital converter ("ADC") is dependent on the ratio of the parasitic capacitance at the top node ($C_{top}$) to all other nodes except the bottom node and the capacitance ($C_{sig}$) that is the useful floating signal capacitance between both nodes. It is desirable to shield the top plate from ground currents or voltage supply fluctuations so that $C_{top}$ remains low. Using the bottom node to essentially surround the top node isolates the top node from coupling with other nodes in the circuit by essentially forming a portion of Faraday shell around the top node, and in some embodiments, distancing the top node from other conductive elements in the IC. It is understood by those of skill in the art that electrical connection to the top node is made through the bottom node shield, and therefore the bottom node shield does not completely surround the top node.

Capacitors are generally useful in a wide variety of integrated circuits and in a wide variety of applications. For instance, one or more capacitors may be useful for a switched capacitor network, such as in an analog-to-digital converter, or as a decoupling or filtering capacitor for AC signaling (e.g., in an MGT). In general, the capacitor structure described herein may be useful in any application requiring capacitance. Note that a capacitor is generally thought of as a two terminal device, and the "top" and "bottom" nodes as described herein generally correspond to these two terminals of the capacitor. Thus, the structures described below may be thought of as connecting (e.g., electrically) to one or the other node, or forming portions of a node. A node is not separate from the capacitive structures connected to it, but those structures may form portions of a node.

Design rules typically have a maximum trace (filament) width, and layers, such as the top, middle, and bottom 140 layers of the integrated capacitor 100 are formed of conductive strips, rather than a contiguous conductive plate. In an alternative embodiment, the bottom conductive layer is formed in a polysilicon or silicide layer, rather than being patterned in a metal layer, and is formed as a contiguous conductive plate. In some embodiments, other layers may be formed as contiguous conductive plates, depending on the limitations of the manufacturing process. For instance, wider metal strips or even metal plates may be used in some embodiments. As another example, in a multiple poly process, multiple poly contiguous conductive plates may be used. Also, in some instances "trench" contacts and vias may be used, which may increase the capacitive and shielding effects of the curtains.

The capacitance between the nodes of the capacitor is established by the capacitive coupling between the conductive elements connected to the bottom node and the conductive elements connected to the top node, as is well known in the art. Although the horizontal and vertical spacing between conductive filaments is shown as being about equal, in many IC fabrication technologies, the vertical separation between patterned metal layers is greater than the minimum required separation between conductive filaments within a patterned metal layer. For purposes of discussion, the capacitance between conductive filaments within a layer, such as between top node conductive filament 124 and bottom node conductive filament 132 will be referred to as lateral capacitance, and the capacitance between top node conductive filament 124 and bottom node conductive filament 126 or 122 will be referred to as vertical capacitance. In deep submicron processes, the lateral capacitance per unit length of adjacent filaments can be greater than the vertical capacitance if the inter-filament spacing is sufficiently close. The spacing and width of the various elements may be varied in some embodiments. For instance, non-minimum width and/or spacing may be used, which may improve manufacturability or reliability. In general, the dimensions may be chosen to meet the needs of the particular application.

Figure 1B:
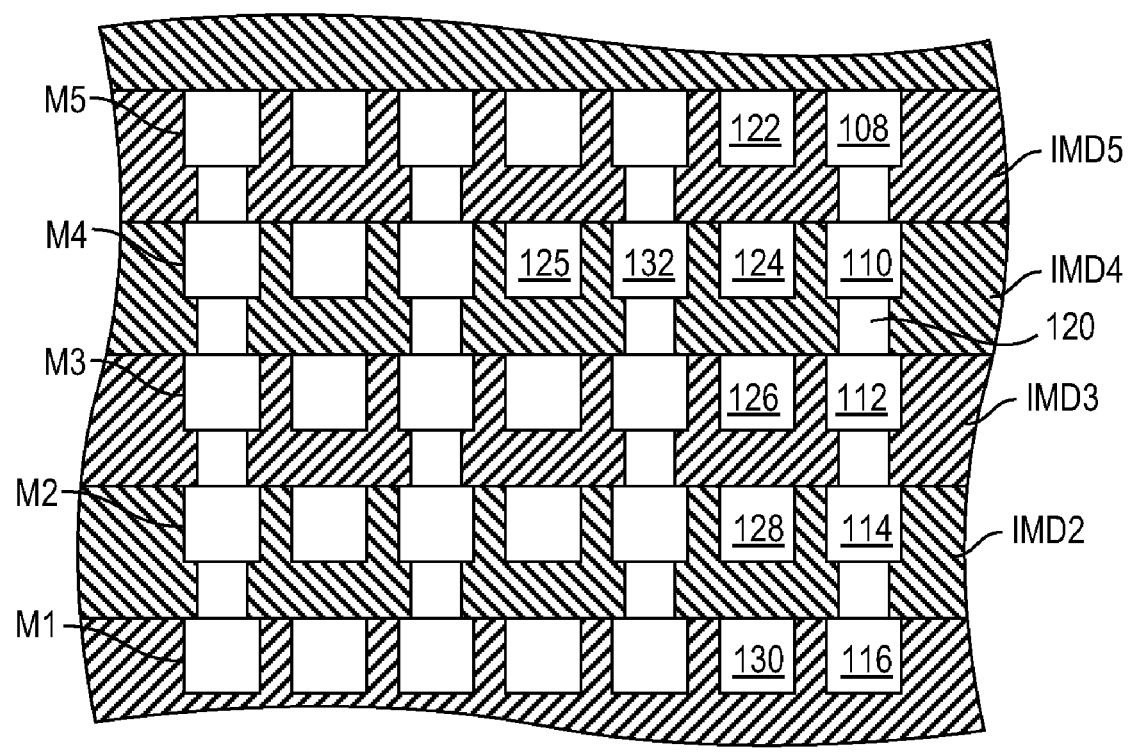
FIG. 1B is a side view of the integrated capacitor of FIG. 1A incorporated in the backend layers of an integrated circuit.

FIG. 1B is a side view of the integrated capacitor of FIG. 1A incorporated in the backend layers of an integrated circuit. The backend layers include five metal layers M1, M2, M3, M4, M5 and intervening dielectric layers IMD2, IMD3, IMD4, IMD5. Conductive vias, such as conductive via 120, connect conductive structures, such as conductive filaments 110, 112. In a particular embodiment, conductive vias and metal layers are formed using dual damascene and chemical-mechanical polishing ("CMP") techniques. In an alternative embodiment, a polysilicon layer, silicide layer, or doped semiconductor (i.e., a conductive well formed in a semiconductor wafer) is used for one or more lower conductive layers. In a further embodiment, the polysilicon layer, silicide layer, or doped semiconductor forms a contiguous conductive plate, rather than conductive filaments. In a yet alternative layer, a polysilicon layer, silicide layer, or doped semiconductor is used to form a ground shield shielding the bottom node conductive filaments in the M1 layer.

FIG. 2A is an isometric view of a portion of an integrated capacitor 200 with vertical cabled filaments according to an embodiment of the present invention. The term "cabled" refers to vertical filaments 202, 204 electrically connected to a first node of the capacitor extending through apertures in a grid plate 208 electrically connected to a second node of the capacitor such that the vertical filaments are surrounded by second node conductors, similar to how a sheath of a coaxial cable surrounds the center conductor.

Figure 3:
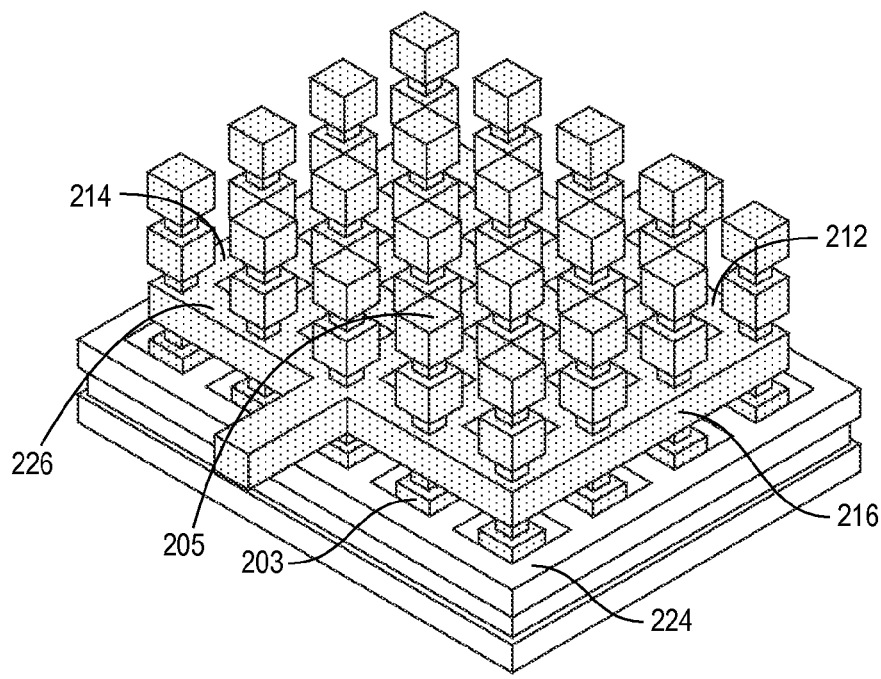
FIG. 3 is an isometric view of the integrated capacitor of FIG. 2A with some of the layers removed to illustrate further details of the integrated capacitor.

A first conductive matrix is formed of vertical conductive filaments 202, 204, 206 and cross members (see FIG. 3, ref. nums. 212, 214) in an intermediate layer (see FIG. 3, ref. num. 216). A center tap 218 extends through a gap 219 in a perimeter shield conductor formed in the third metal layer and allows electrical connection to a distribution grid of the first conductive matrix, which is otherwise essentially surrounded by the perimeter shield conductor. In a particular embodiment, the first conductive matrix is connected to the top node of the integrated capacitor and the second conductive matrix is connected to the bottom node of the integrated capacitor and provides shielding for the top node. The center tap 218 provides electrical connection of the distribution grid and to vertical conductive filaments extending in opposite directions from the distribution grid to a node of the integrated capacitor. In an alternative embodiment, a side of the perimeter shield is omitted, such as when capacitors are stepped to form an array of capacitors. In such embodiments, a single bottom node shield may be shared by two adjacent capacitors, or is optionally omitted. Note that although it is referred to herein as a "center tap," the connection to the first conductive matrix may be made at any point, for instance along the edges, and may be made in any suitable layer, such as M2 or M4.

The second conductive matrix is formed of grid plates 208, 209, 210, 211 above and below a distribution layer (e.g., the layer in which center tap 218 is formed in). In a particular embodiment, the lowest plate layer 209 is formed in a polysilicon or silicide layer as a contiguous sheet. Vertical conductive filaments extend up and down from the distribution layer (see, e.g., FIG. 3) and conductive vias 220, 222. The grid plates are essentially conductive grids that have apertures through which the vertical conductive filaments of the complementary node plate (e.g., the vertical conductive filaments of the top node plate) extend. In a particular embodiment, a vertical conductive filament extends upwards from the distribution layer, and a corresponding vertical conductive filament extends downwards from the distribution layer. This arrangement provides lower and more evenly distributed resistive and inductive components of the capacitor impedance from the distribution layer and center tap, compared to a similar design using long filaments (fingers) connected at their endpoints.

Figure 2B:
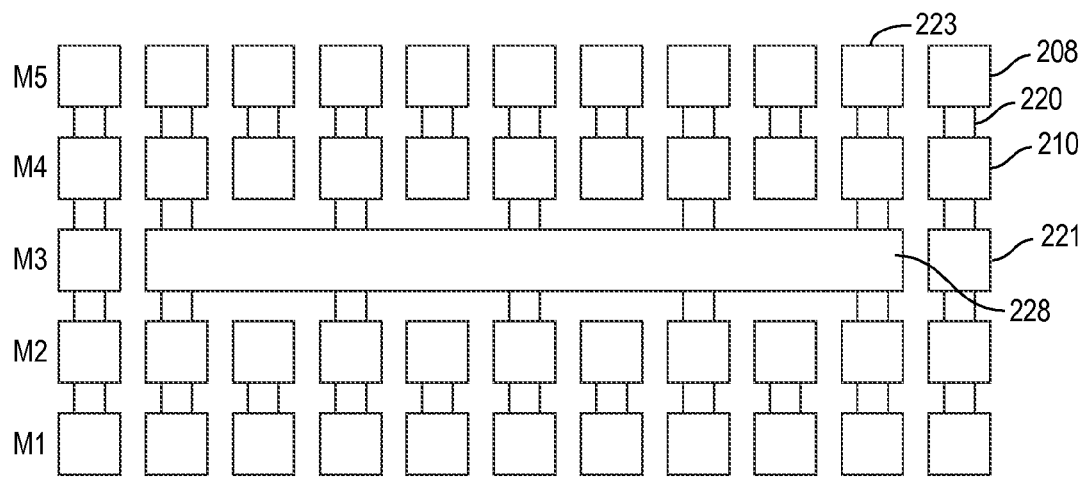
FIG. 2B is a cross section of the integrated capacitor of FIG. 2A as seen along section line B-B.

FIG. 2B is a cross section of the integrated capacitor of FIG. 2A as seen along section line B-B. Only the sectioned portions of the first and second conductive matrices are shown, and intervening dielectric material is omitted for clarity of illustration. The grid plates 208 and 210 surround conductive filament 223 and other conductive filaments extending in both directions from a cross member 228 formed in the intermediate metal layer M3. Conductive vias, such as conductive via 220, electrically connects grid plates 208, 210 formed in successive metal layers M4, M5. Similar conductive vias connect other conductive structures formed in adjacent metal layers M1, M2, M3, M4, M5. In an alternative embodiment, the layers are shifted so that the lowest layer (illustrated M1) is a poly layer formed as a contiguous sheet rather than as filaments.

Alternative embodiments of integrated capacitors are formed in backend stacks having greater or fewer metal layers. For example, an integrated capacitor similar to integrated capacitor 200 of FIG. 2A is formed in a backend stack having four metal layers by forming the bottom-most grid plate and ends of the vertical conductive filaments of the top node matrix in a layer of polysilicon or silicide ("poly" layer). In a further embodiment, the vertical filaments terminate in the M1 layer and the poly layer forms a node shield plate. A node plate can be formed in the poly layer as a contiguous sheet, rather than a series of conductive strips (filaments) or conductive grid. Alternatively, the bottom-most grid plate is formed in a conductive well of a semiconductor substrate, and contacts are used to electrically connect the conductive well to the metal matrix of the bottom node, thus allowing an integrated capacitor according to an embodiment to be formed in a backend stack having three metal layers, using the poly layer. Similarly, additional metal layers allow extending the vertical conductive filaments of the top node and forming associated grid plates around them.

Figure 2C:
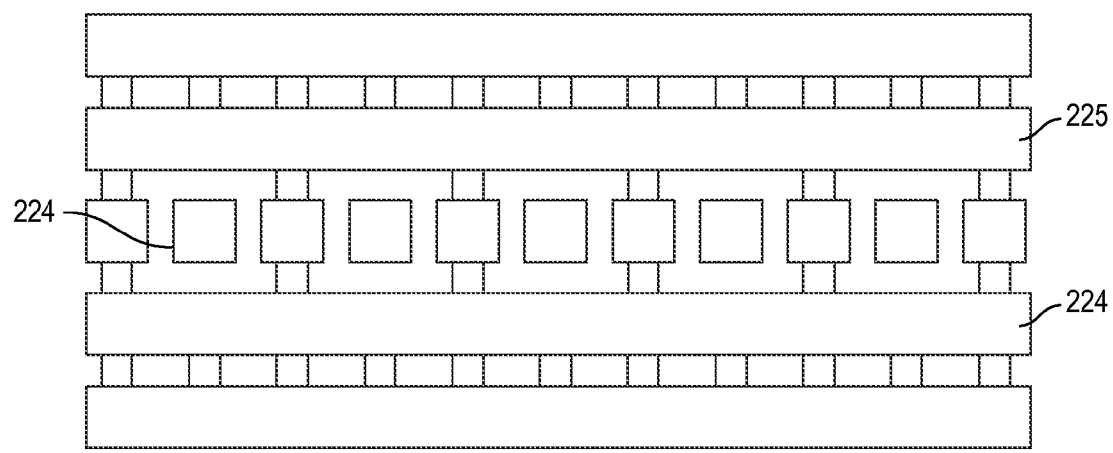
FIG. 2C is a cross section of the integrated capacitor of FIG. 2A as seen along section line C-C.

FIG. 2C is a cross section of the integrated capacitor of FIG. 2A as seen along section line C-C. Only the sectioned portions of the first and second conductive matrices are shown, intervening dielectric material is omitted for clarity of illustration. Top node cross member 214 is surrounded by conductive elements of the bottom node that form a three-dimensional conductive matrix in a distribution layer of the integrated capacitor. A portion of the upper grid plate 225 (removed for purposes of illustration in FIG. 3) and lower grid plate 224 are shown in cross section.

FIG. 3 is an isometric view of the integrated capacitor of FIG. 2A with some of the layers removed to illustrate further details of the integrated capacitor. A grid plate 224 connected to the bottom node is below a distribution grid 226, which is connected to the top node. The distribution grid has cross members 212, 214 connecting vertical filaments 203, 205 extending in opposite directions from the distribution layer (e.g., M3). The top node distribution layer is formed in the middle layer, but is alternatively formed in other layers. In some embodiments, the vertical filaments extend further in one direction (i.e., thorough more metal layers) than in the opposite direction.

Figure 4:
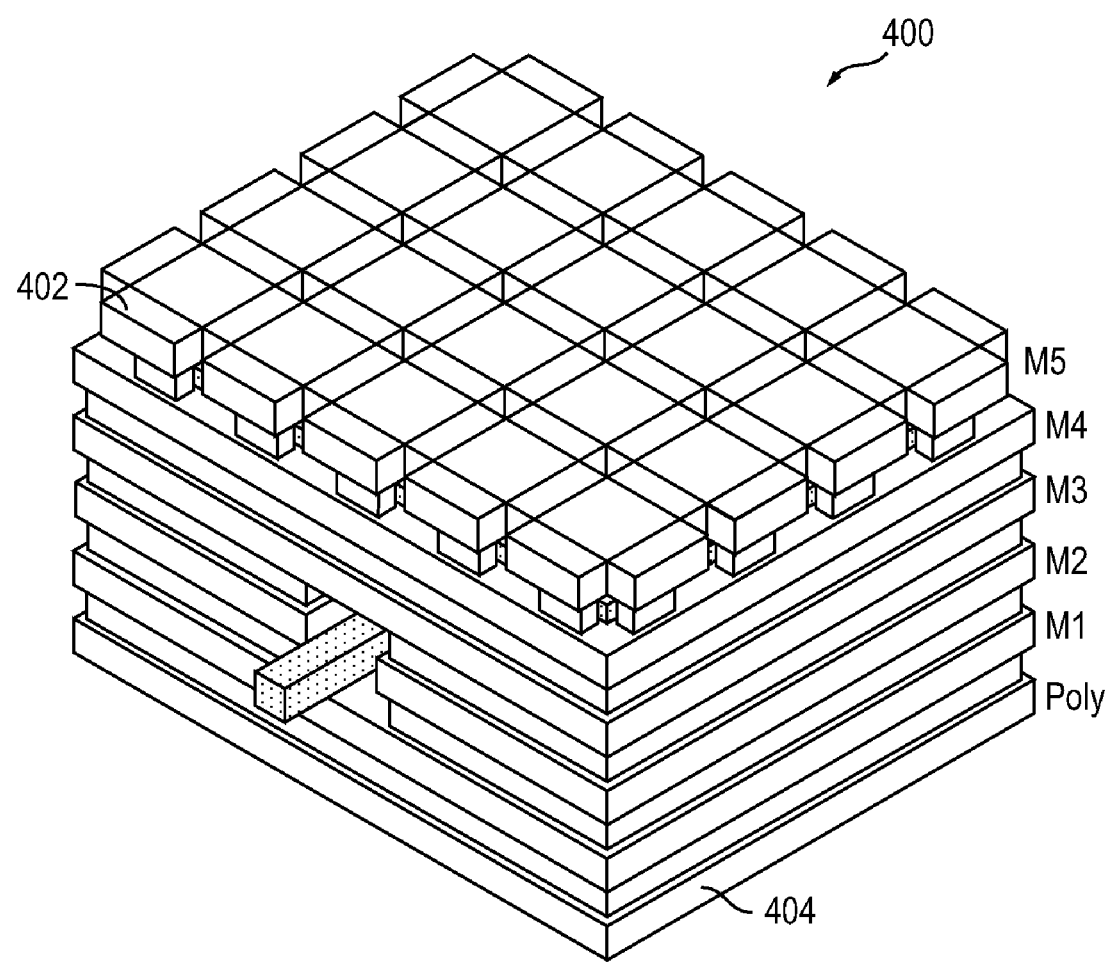
FIG. 4 is an isometric view of the integrated capacitor of FIG. 2A with plate encasings according to another embodiment.

FIG. 4 is an isometric view of an integrated capacitor 400 similar to the embodiment of FIG. 2A with plate encasings 402 according to another embodiment. The plate encasings cover the top ends of the vertical conductive filaments of the top node and provide additional shielding to the top node, as well as increasing the specific capacitance per unit area of the integrated capacitor, as the ends of conductive filaments capacitively couple with the plate encasings. In this embodiment, the lowest conductive grid plate 404 is formed in a polysilicon or silicide layer ("poly" layer), and metal layers M1, M2, M3, M4 are used to form conductive matrices of the integrated capacitor in conjunction with the poly, and with metal layer M5. Thus, the integrated capacitor 400 including the plate encasings 402 are achieved in a five-metal layer backend stack.

Note that the types of and number of layers described are merely examples, and in some embodiments other suitable layers may be used, and any number of layers may be used. For example, the layers used may depend on the types and numbers of layers that are available in the manufacturing process, and other arrangements will be apparent to those of skill in the art. In general, any suitable layer, and an arbitrary number of layers may be used in accordance with embodiments of the present invention.

Figure 5:
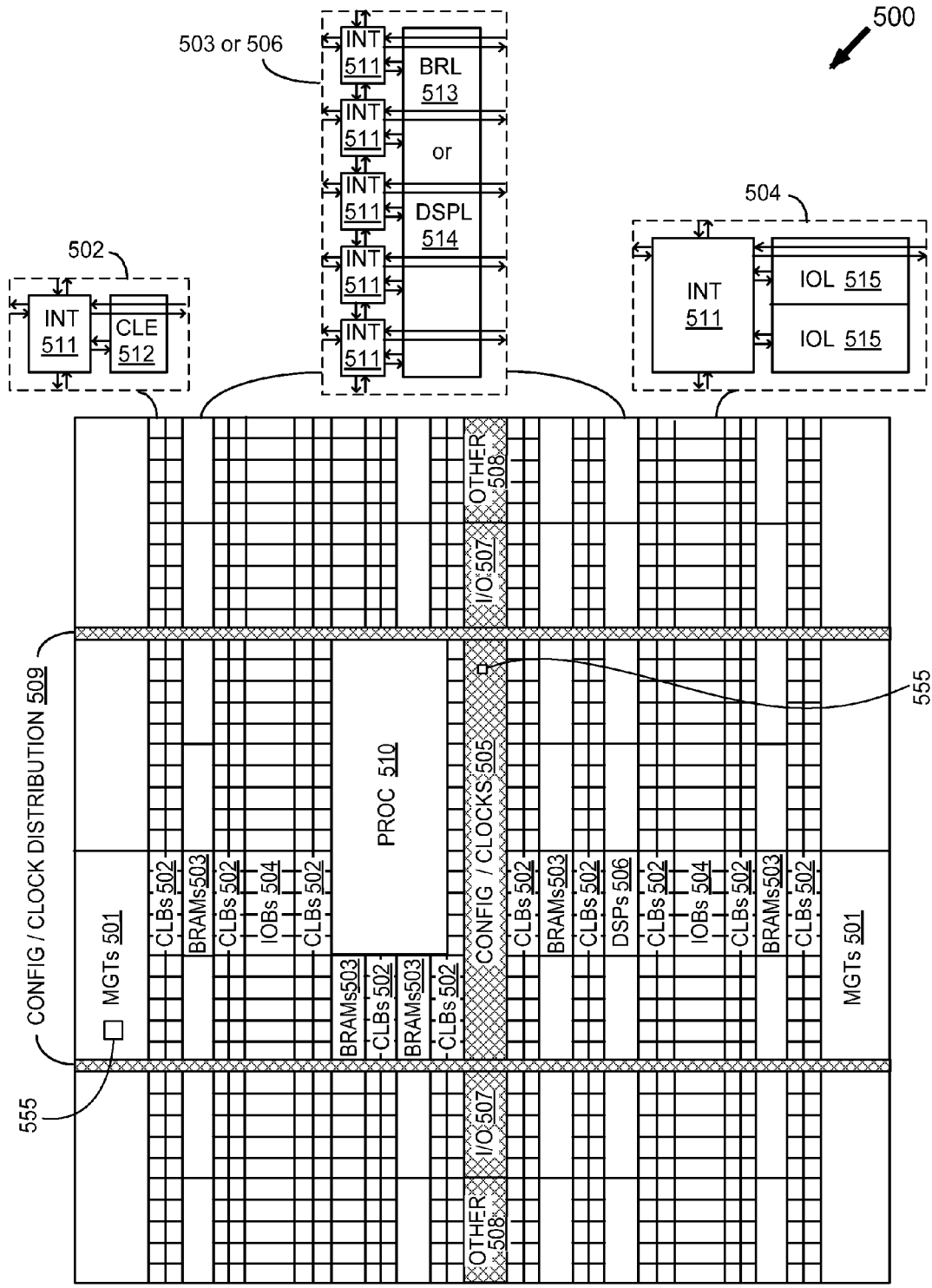
FIG. 5 is a plan view of an FPGA incorporating an integrated capacitor according to an embodiment.

FIG. 5 is a plan view of an FPGA 500 semiconductor device incorporating an integrated capacitor according to an embodiment. The FPGA 500 includes CMOS portions in several of the functional blocks, such as in RAM and logic, and is fabricated using a CMOS fabrication process. One or more integrated capacitors 555 according to one or more embodiments of the invention are incorporated in any of several functional blocks of the FPGA, such as a clock circuit 505, a multi-gigabit transceivers 501, or other functional block; within many functional blocks; or within a physical section or segment of the FPGA 500. Integrated capacitors 555 are particularly desirable in applications where one or both terminals of the capacitor are switched, and embodiments including top node shielding are further desirable in applications wherein the top node is connected to or switched to a high-impedance or high-gain node of a circuit in the FPGA 500.

The FPGA architecture includes a large number of different programmable tiles including multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal processing blocks (DSPs 506), specialized input/output blocks (I/O 507) (e.g., configuration ports and clock ports), and other programmable logic 508 such as digital clock managers, analog-to-digital converters, system monitoring logic, and so forth. Some FPGAs also include dedicated processor blocks (PROC 510).

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element (INT 511) also includes the connections to and from the programmable logic element within the same tile, as shown by the examples included at the top of FIG. 5.

For example, a CLB 502 can include a configurable logic element (CLE 512) that can be programmed to implement user logic plus a single programmable interconnect element (INT 511). A BRAM 503 can include a BRAM logic element (BRL 513) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 506 can include a DSP logic element (DSPL 514) in addition to an appropriate number of programmable interconnect elements. An IOB 504 can include, for example, two instances of an input/output logic element (IOL 515) in addition to one instance of the programmable interconnect element (INT 511). As will be clear to those of skill in the art, the actual I/O pads connected, for example, to the I/O logic element 515 are manufactured using metal layered above the various illustrated logic blocks, and typically are not confined to the area of the input/output logic element 515. In the pictured embodiment, a columnar area near the center of the die (shown shaded in FIG. 5) is used for configuration, clock, and other control logic. Horizontal areas 509 extending from this column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA more than one adjacent column of CLBs is typically included wherever the CLBs appear, to facilitate the efficient implementation of user logic.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A capacitor in an integrated circuit ("IC") comprising:
   a distribution grid, associated with a first node of the capacitor, formed in a first patterned metal layer of a plurality of metal layers of the integrated circuit, the plurality of metal layers comprising successive metal layers separated by dielectric layers;
   a first vertical conductive filament connected to and extending away from the distribution grid along a first axis in a first direction, wherein the first vertical conductive filament is electrically connected to the first node only through the distribution grid;
   a second vertical conductive filament connected to and extending away from the distribution grid along the first axis in a second direction opposite the first direction, wherein the second vertical conductive filament is electrically connected to the first node only through the distribution grid;
   a first grid plate, associated with a second node of the capacitor, formed in a second patterned metal layer which is a next successive metal layer adjacent to the first patterned metal layer, the first grid plate surrounding the first vertical conductive filament in the second patterned metal layer; and
   a second grid plate, associated with the second node of the capacitor, formed in a third patterned metal layer which is a next successive metal layer adjacent to the second patterned metal layer, the second patterned metal layer disposed between the first patterned metal layer and the third patterned metal layer, the second grid plate surrounding the first vertical conductive filament in the third patterned metal layer.

2. The capacitor of claim 1 wherein the first node is a top node of a switching capacitor in the IC.

3. The capacitor of claim 1 wherein the first patterned metal layer further includes a perimeter shield conductor electrically connected to and forming a second portion of the second node at least partially surrounding the distribution grid in the first patterned metal layer.

4. The capacitor of claim 3 wherein the first patterned metal layer further includes a center tap extending through a gap in the perimeter shield conductor to the distribution grid.

5. The capacitor of claim 1 further comprising:
   a first number of sequential grid plates formed in sequential metal layers above the first patterned metal layer, each of the first number of sequential grid plates being electrically connected to the second node of the capacitor, and
   a second number of sequential grid plates formed in sequential metal layers below the first patterned metal layer, each of the second number of sequential grid plates being electrically connected to the second node of the capacitor, the first vertical conductive filament being surrounded by each of the first number of sequential grid plates, and the second vertical conductive filament being surrounded by each of the second number of sequential grid plates, the first number being greater than one and the second number being greater than one.

6. The capacitor of claim 5 wherein the first number equals the second number.

7. The capacitor of claim 5 wherein one of the second number of grid plates is formed in a polysilicon or silicide layer of the IC.

8. The capacitor of claim 1 comprising a first plurality of vertical conductive filaments, each of the first plurality of vertical conductive filaments being electrically connected to the first node only through the distribution grid and extending through and being surrounded by the first grid plate and a second plurality of vertical conductive filaments, each of the second plurality of vertical conductive filaments being electrically connected to the first node only through the distribution grid and extending through and being surrounded by the second grid plate.

9. The capacitor of claim 8 further comprising a first plate encasing covering first ends of the first plurality of vertical conductive filaments, the first plate encasing being electrically connected to the second node.

10. The capacitor of claim 9 further comprising a second plate encasing covering second ends of the second plurality of vertical conductive filaments, the second plate encasing being electrically connected to and forming a third portion of the second node.

11. The capacitor of claim 10 wherein the second plate encasing is formed in a polysilicon or silicide layer of the IC.

12. The capacitor of claim 1 wherein the capacitor is located in an analog-to-digital converter.

13. The capacitor of claim 1 wherein the capacitor is located in a transceiver.

14. The capacitor of claim 1 wherein the integrated circuit is a field programmable gate array.

15. The capacitor of claim 1 further comprising a third grid plate, associated with the second node of the capacitor, formed in a fourth patterned metal layer, the first patterned metal layer including a grid plate element surrounded by the distribution grid, wherein the first grid plate is connected to the third grid plate through the grid plate element in the first patterned metal layer.

* * * * *